(12) United States Patent
Bode

(10) Patent No.: US 7,952,937 B2
(45) Date of Patent: May 31, 2011

(54) WORDLINE DRIVER FOR A NON-VOLATILE MEMORY DEVICE, A NON-VOLATILE MEMORY DEVICE AND METHOD

(75) Inventor: Hubert M. Bode, Haar (DE)

(73) Assignee: Freescale Semiconductor, Inc., Austin, TX (US)

( * ) Notice: Subject to any disclaimer, the term of this patent is extended or adjusted under 35 U.S.C. 154(b) by 162 days.

(21) Appl. No.: 12/282,548

(22) PCT Filed: Mar. 16, 2006

(86) PCT No.: PCT/EP2006/002406
§ 371 (c)(1),
(2), (4) Date: Sep. 11, 2008

(87) PCT Pub. No.: WO2007/104335
PCT Pub. Date: Sep. 20, 2007

(65) Prior Publication Data
US 2009/0027972 A1   Jan. 29, 2009

(51) Int. Cl.
*G11C 16/06* (2006.01)

(52) U.S. Cl. ......... 365/185.23; 365/185.18; 365/185.29; 365/189.09

(58) Field of Classification Search ............. 365/185.23, 365/189.11, 189.09, 230.06, 185.18, 185.29
See application file for complete search history.

(56) References Cited

U.S. PATENT DOCUMENTS

| | | | |
|---|---|---|---|
| 5,513,147 A * | 4/1996 | Prickett, Jr. | 365/230.06 |
| 5,693,570 A | 12/1997 | Cernea et al. | |
| 5,784,327 A | 7/1998 | Hazani | |
| 5,963,477 A * | 10/1999 | Hung | 365/185.22 |
| 6,466,478 B1 | 10/2002 | Park | |
| 6,618,297 B1 | 9/2003 | Manea | |
| 6,791,873 B1 | 9/2004 | Perner | |
| 6,865,110 B1 | 3/2005 | Park | |
| 6,914,818 B2 * | 7/2005 | Yamazaki et al. | 365/185.18 |
| 7,457,178 B2 * | 11/2008 | Tu et al. | 365/201 |
| 7,724,600 B1 | 5/2010 | Im et al. | |

(Continued)

FOREIGN PATENT DOCUMENTS

EP   0734024 A1   9/1996

(Continued)

OTHER PUBLICATIONS

Non-Final Office Action mailed Nov. 29, 2010 for U.S. Appl. No. 12/282,543, 13 pages.

(Continued)

Primary Examiner — Huan Hoang
Assistant Examiner — Kretelia Graham

(57) ABSTRACT

A wordline driver, for a non-volatile memory device, comprises a wordline driver output, a first power source, adapted to provide an erase level voltage for erasing portions of the non-volatile memory device, a second power source, adapted to provide read and program level voltages for reading and programming portions of the non-volatile memory device and first switching means, including an isolation transistor, adapted to connect the wordline driver output to a one of the first and second power sources dependent upon an operating mode of the wordline driver. The wordline driver further comprises a programmable switch controller for providing a variable control signal to a control electrode of the isolation transistor. The programmable switch controller is arranged to set the variable control signal to a value dependent upon the operating parameters of the non-volatile memory device and such that the endurance of the isolation transistor is maximised.

18 Claims, 12 Drawing Sheets

U.S. PATENT DOCUMENTS

| | | |
|---|---|---|
| 2001/0005015 A1 | 6/2001 | Futatsuyama et al. |
| 2003/0179608 A1 | 9/2003 | Iorio |
| 2004/0046681 A1 | 3/2004 | Frulio et al. |
| 2005/0219914 A1 | 10/2005 | Sarin et al. |
| 2007/0041244 A1 | 2/2007 | Chih et al. |
| 2008/0123427 A1 | 5/2008 | Hsu |
| 2009/0097323 A1 | 4/2009 | Bode |
| 2009/0097324 A1 | 4/2009 | Bode |
| 2010/0246267 A1 | 9/2010 | Hasler et al. |

FOREIGN PATENT DOCUMENTS

| | | |
|---|---|---|
| EP | 0880143 A2 | 11/1998 |
| WO | 0124191 A | 4/2001 |

OTHER PUBLICATIONS

Notice of Allowance mailed Oct. 5, 2010 for U.S. Appl. No. 12/282,547, 11 pages.

\* cited by examiner

WORDLINE DRIVER FOR A NON-VOLATILE MEMORY DEVICE, A NON-VOLATILE MEMORY DEVICE AND METHOD

CROSS-REFERENCE TO RELATED APPLICATIONS

The present application is related to co-pending U.S. patent application Ser. No. 12/282,547, entitled "NON-VOLATILE MEMORY DEVICE AND A PROGRAMMABLE VOLTAGE REFERENCE FOR A NON-VOLATILE MEMORY DEVICE," filed on Sep. 11, 2008, and U.S. patent application Ser. No. 12/282,543, entitled "BITLINE CURRENT GENERATOR FOR A NON-VOLATILE MEMORY ARRAY AND A NON-VOLATILE MEMORY ARRAY," filed on Sep. 11, 2008.

FIELD OF INVENTION

The present invention relates to programmable non-volatile memory devices, and more particularly to an improved wordline driver for a non-volatile memory device, such as an electrically erasable programmable read only memory.

BACKGROUND OF THE INVENTION

Non-volatile memory (NVM) is the general term used to describe the type of memory that retains its data even when power is turned off, and this sort of memory is typically used to store data that must not be lost when a device incorporating the memory looses power. Such devices include computers, CD-ROMs, mobile phones, digital cameras, compact flash cards, mp3 players and Micro-Controller Units (MCUs) from the automotive, aero and other industries.

Types of non-volatile memory include Read Only Memory (ROM), Electrically Programmable Read Only Memory (EPROM), Electrically Erasable and Programmable Read Only Memory (EEPROM), Flash EEPROMs, Non-Volatile Static Random Access Memory (NVSRAM), Ferroelectric Random Access Memory (FeRAM), and the like.

Whilst some non-volatile memory is purely "read only", with the "programming" being done by hard-coding the data during the memory fabrication process, other types are programmed electrically post-fabrication.

One type of programmable non-volatile memory the present invention relates to is Electrically Erasable and Programmable Read Only Memory (EEPROM), however the invention may equally be applied to other non-volatile memory types listed above. Electrically Erasable and Programmable Read Only Memory (EEPROM) can be split into two sub types: byte erasable and Flash EEPROM. As the name suggests, the byte erasable type can be erased and written in byte size chunks, whilst flash memory is written in byte (or larger) sized chunks, but is erased in sections (which are multiple bytes in size). The size of the sections erased in flash memory is part specific, and can be anywhere in size from meaning the entire memory array of the device to only a sub-portion, or sector, comprising a small number of individual bytes.

EEPROMs store information by storing charge on an insulated piece of semiconductor material, known as the floating gate. Typically, the insulating material is a layer of Silicon Dioxide. As is known in the art, this charge is moved onto the insulated material forming the memory cell by either Hot Carrier Injection (HCI) or Fowler-Nordheim Tunneling (FNT). Each individual memory cell can store a single bit of information, thus they are often referred to as bitcells.

Briefly, Hot Carrier Injection (via either Hot holes, i.e. positive charges, or Hot electrons, i.e. negative charges) works by applying a large voltage bias across the channel of the bitcell, resulting in the "heating", i.e. energy injection, of the carriers within the channel, which provides some of them with enough energy to surmount the silicon dioxide energy barrier, and thus are "injected" into the insulated material.

Meanwhile, Fowler-Nordheim tunneling works by applying a high electric field between the gate of the bitcell and either the source or drain. Assuming the field is high enough, this high electric field lowers the height of the energy barrier of the silicon dioxide layer and thus allows electrons to "tunnel" across the insulated material and onto the floating gate forming the bitcell.

While either Hot Carrier Injection or Fowler-Nordheim Tunneling may be used to move charge onto the insulated floating gate of the bitcell, charge may only be removed from the insulated floating gate by Fowler-Nordheim tunneling. When using Fowler-Nordheim tunneling to remove charge from the floating gate, opposite bias conditions need to be applied.

The movement of the charge onto or off the floating gate is known as "programming" (of the bitcell). However, "programming" does not in itself refer to a particular data state of the bitcell (1 or 0), because due to possible logical inversion at the output from the core memory array and/or the output to the data bus, the programmed state may correspond to either a logic 1 or 0. For this reason, in the following description it will be assumed that "programmed" means that charge has been stored on the floating gate, whilst "unprogrammed" means that little or no charge is stored in the floating gate.

As is known in the art, the above described physical methods used to program the bitcells are carried out by biasing the terminals of the bitcell to be programmed (or read, or erased) with the correct voltages.

Since EEPROMs can be electrically erased and reprogrammed, whilst still being able to retain information without power needing to be continually applied, they are well suited to applications that require values or other data to be permanently stored, yet updated on an ongoing basis. As a result, the memory may be cycled between programmed and erased states many times over.

Regardless of the type of EEPROM, there are a number of factors that are used to determine the equality or usefulness of the memory device. The first of these factors is the endurance of the memory device.

The number of erase/program cycles a non-volatile memory device can withstand before it no longer keeps the information correctly is called its endurance. Typical values for the endurance of a non-volatile bitcell range from 10000 to over 5 Million erase/program cycles.

Unfortunately, the erase method used in EEPROMs requires high voltages to be applied, and it is this high voltage that degrades the electrical operation of each bitcell over time. The cumulative effect of this electrical degradation results in the bitcell no longer being able to store information, and hence reduces the endurance of the memory device as a whole.

Another factor used to grade the quality of an EEPROM device is its ability to retain data. Since non-volatile EEPROMs store information by storing charge on an electrically isolated piece of semiconductor material, if the isolation is lost, or even just reduced, charge can leak out of the floating gate, resulting in loss of the data stored. The isolation is typically achieved using oxides of the semiconductor material (e.g. silicon dioxide), and any defect in this oxide can result in the aforementioned charge leakage. It is to be noted that it is the effect of erasing at high voltage that partly results in this oxide layer degradation.

Speed of electrical switching, especially in semiconductor devices, is a function of the impedance of the switching part. If the impedance is high, the speed of switching is low, whilst when the impedance is low, the speed of switching is high. This means that it is desirable to have a low read driver impedance to enable fast read access times to these EEPROM devices.

Wordline drivers influence the performance of a non-volatile memory device in two major areas. The first is read access time. Wordline drivers need to be fast to be able to charge up/discharge the wordlines for read operations. The second is that wordline drivers are operated at high voltages for the erase operation, so they need to be robust with respect to transistor wear out (via degradation of the insulation layer that isolates the floating gate from the rest of the bitcell).

Existing wordline driver circuits often combine the output transistor of the wordline driver so that it can drive all three required levels, i.e. the levels required for reading, programming and erasing the bitcells. This requires switched supplies, which compromise the impedance of the read select driver and hence the read access time.

Additionally, prior art wordline driver circuits use current biased zener stacks for wordline voltage generation during program (as the supply to the above described single driver) which limits ProgFF disturb margin on the one side or programmability on the other side. Note, during program only some of the bitcells are meant to be changed from erased to programmed state in order to achieve the desired memory pattern. However, bitcells on the same wordline see the same high voltage used for programming, which may endanger their present state. Their immunity to withstand the high voltage used to program other bitcells on the same wordline is called ProgFF disturb margin.

Also, such circuits do not have protection against bitline voltages that are too low, and they have to rely on the programmed bitcell to avoid column disturb. Moreover, such circuit techniques typically use special devices (for example, memory cells with accessible floating gates), which are difficult to port to different fabrication processes.

In essence, the prior art suffers a trade off between speed of read access time versus erase endurance, resulting in one or other of them being satisfied at the expense of the other.

Accordingly, it would be desirable to provide a wordline driver for a non-volatile memory device that improves endurance and data retention of the memory device and can also provide a reduced read impedance to improve read access times.

SUMMARY OF INVENTION

The present invention provides a wordline driver as set out in the accompanying claims.

BRIEF DESCRIPTION OF THE DRAWINGS

A wordline driver for a non-volatile memory device in accordance with the invention will now be described, by way of example only, with reference to the accompanying drawings in which.

SPECIFIC DESCRIPTION

Figure 1:
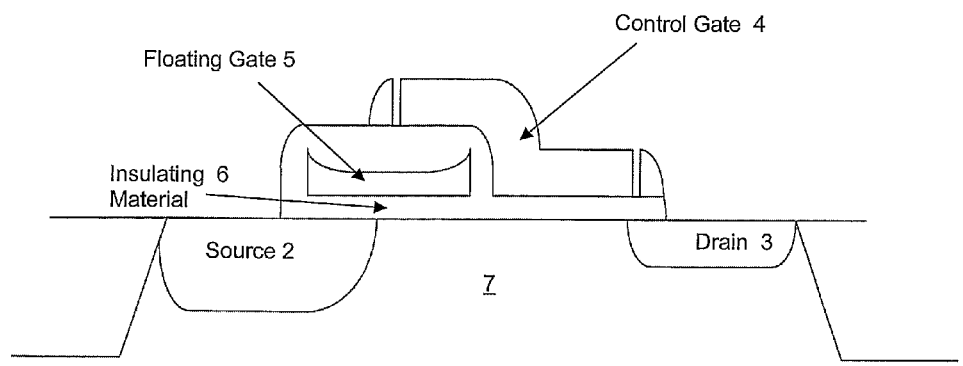
FIG. 1. shows a side view schematic of a typical 1.5 transistor split gate memory bitcell, exemplary of the type suitable for use with the present invention.

FIG. 1 shows a side view schematic detailing the construction of an example 1.5-transistor split gate non-volatile memory bitcell 10, which is typical of the type of bitcell 10 used in such non-volatile memory devices. However, the present invention equally applies to other forms of bitcells, for example 1-transistor bitcells and 2-transistor bitcells. The actual type of bitcell used only effects the exact bias conditions required.

The non-volatile memory bitcell 10 comprises a source 2, a drain 3, a control gate 4, a floating gate 5, insulating material 6, all formed on a silicon substrate 7. The bitcell 10 is constructed using the typical techniques known in the art for constructing semiconductors, including lithographic techniques, ion implantation and the like. The insulating material 6 is, for example, silicon dioxide.

Figure 2:
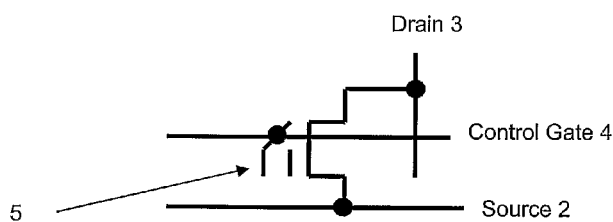
FIG. 2. is a electrical schematic of the 1.5 transistor memory bitcell of FIG. 1.

FIG. 2 is a typical electrical schematic symbol for the 1.5-transistor bitcell 10 of FIG. 1, which will be used in the subsequent figures.

Figure 3:
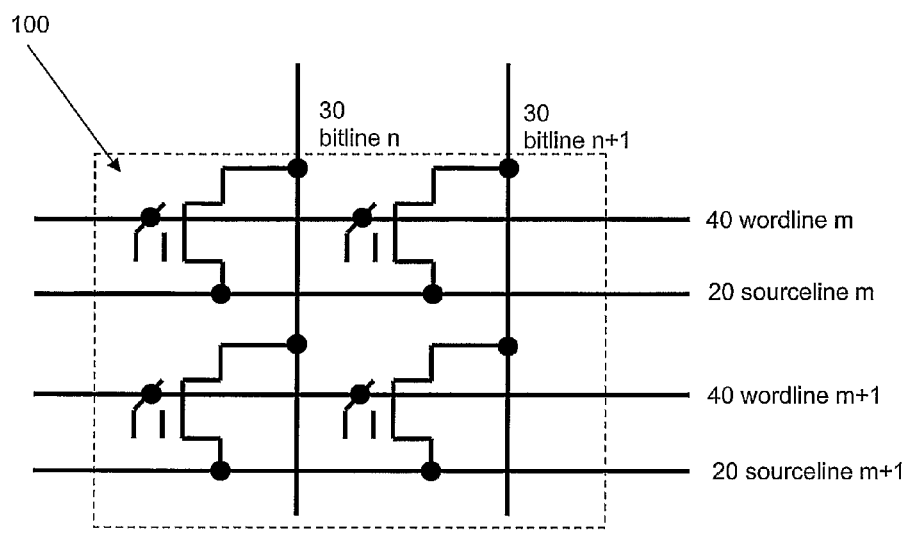
FIG. 3 is a schematic diagram of four bitcells of FIG. 1 arranged in the typical array configuration, suitable for use with the present invention.

Non-volatile memory (NVM) is typically constructed in the form of an N by M array 100, with N columns and M rows of bitcells 10, as shown in FIG. 3.

As can be seen from this figure, bitcells 10 in the same column have their respective drains 3 connected to a common bitline 30. Meanwhile, bitcells 10 in the same row have their sources 2 connected to a common sourceline 20 and their control gates 4 connected to a common wordline 40.

In this way, each column is addressed by a single bitline 30, and each row is addressed by both a wordline 40 and sourceline 20. Accordingly, bitcells 10 are read, erased or programmed by applying the correct voltage levels to the respective bitline 30, wordline 40 and sourceline 20 of the desired bitcell(s) 10.

In standby mode, all bitlines 30, wordlines 40 and sourcelines 20 are held at their standby voltages, for example 0V.

In the following description of Erase, Program and Read operations for an non-volatile memory array 100, an exemplary portion of an non-volatile memory array 100 is shown. Since (for a flash device) an erase operation cannot be divided in to portions smaller than a wordline, both bitcells 10 in the top row are selected, and therefore are erased. For Program and Read operations, however, the selected bitcell 10 (i.e. the bitcell 10 to which the operation in question is being applied) is the top left bitcell 10. The remaining bitcells are all unselected. Also where, in the example given, only one bitcell 10 is being operated on, it will be apparent to the person skilled in the art that multiple locations, i.e. a byte or more, can be operated on at the same time, according to the abilities of the circuits used to address the bitcells 10 in the memory array 100.

Erase Operation

Figure 4:
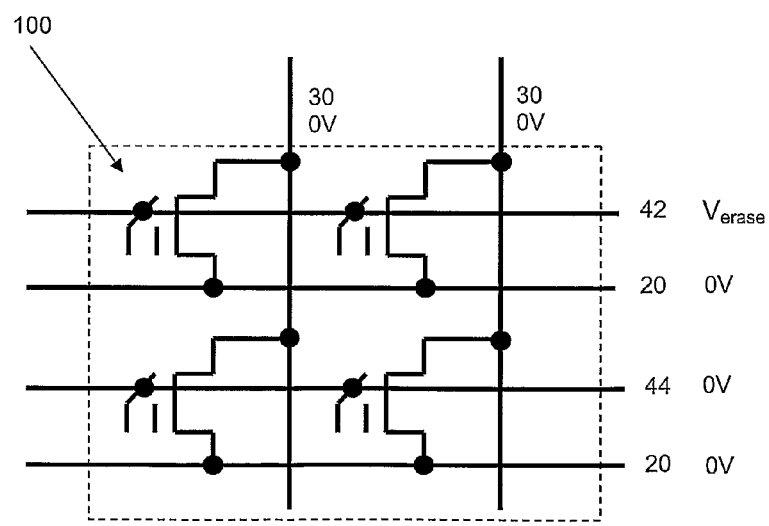
FIG. 4 is a schematic diagram of an example of the voltage bias conditions applied to the array of FIG. 3 during erase of the top row of bitcells.

FIG. 4 shows a portion of an non-volatile memory array 100 with the correct voltage levels applied for erasing the top row of bitcells 10. However, in Flash EEPROM memory in particular, these erasure voltages will be applied to multiple groups of bitcells 10 forming an erase sector, or equally the whole array in some cases.

During erase, all bitlines 30 and sourcelines 20 are grounded, i.e. held at 0V. Unselected wordlines 44 are also grounded. Meanwhile, all selected wordlines 42 are driven to the high voltage required for erasure, in this example, the erasure voltage, $V_{erase}$, is approximately 13.5V.

When the above bias conditions are set, Fowler-Nordheim Tunneling between the control gate 4 and the floating gate 5 will reduce the number of electrons on the floating gate 5, thus increasing the potential on the floating gate 5. After erase operation, the channel below the floating gate 5 will be left in conducting state.

In the case of the exemplary split gate 1.5 transistor memory cell shown in the examples, there are in fact two portions of the channel. The first portion is below the floating gate 5, whilst the second portion is the adjacent one below the control gate 4. Together they both form the complete channel.

While the one below the control gate 4 can be made conducting or non conducting by the potential applied to the control gate 4 (and therefore we use this channel to "point" to the desired bitcells to be read or programmed), the channel below the floating gate 5 is conducting or non-conducting due to the amount of charge left on the floating gate 5. This is the memory part of the bitcell. The structure is equivalent to two transistors connected in series. The control gate 4 extends over the floating gate 5 in order for it to be able to erase the floating gate 5 with a high potential on the control gate 4.

Program Operation

Figure 5:
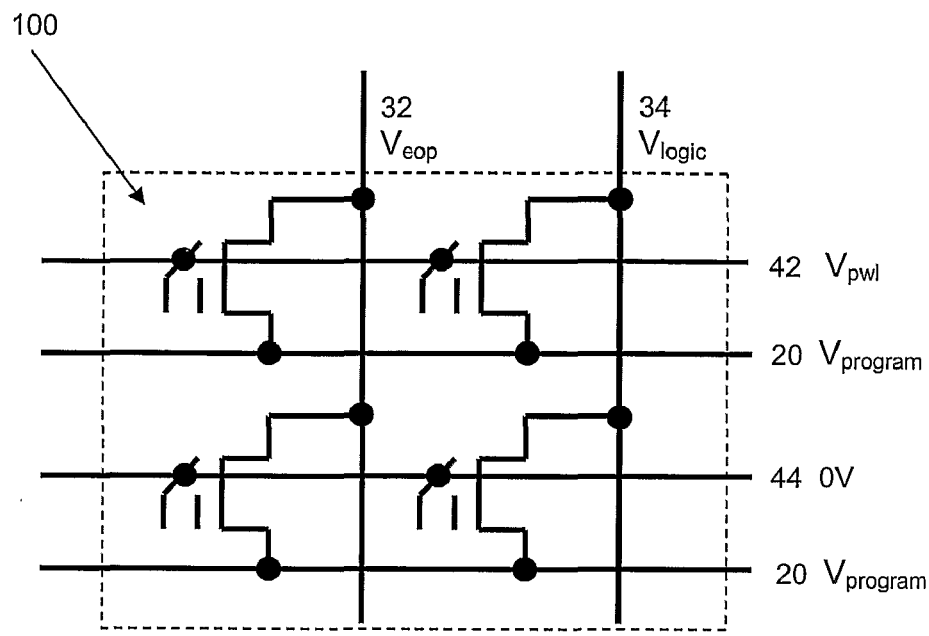
FIG. 5 is a schematic diagram of an example of the voltage bias conditions applied to the array of FIG. 3 during programming of the top left bitcell in the array.

FIG. 5 shows the same portion of non-volatile memory array 100, but with the correct voltage bias levels applied for programming the top left bitcell 10 instead.

During program, all sourcelines 20 are driven to the high voltage required for programming, $V_{program}$, which in this example is 10V. In this way, the sourcelines 30 act as the bitcell transistor's drain. Unselected wordlines 44 are driven to ground (0V) and unselected bitlines 34 are driven to logic supply, $V_{logic}$, which in this example is 2.7V.

Meanwhile, the selected wordlines 42 are driven to the wordline programming voltage, $V_{pwl}$, which in this example is set to 2.1V, and the selected bitlines 32 are pulled towards an end of programming voltage, $V_{eop}$, which in this example is set to 0.7V.

By setting the above bias conditions, current is driven through the bitcell 10, thus generating hot carriers which can then be moved onto the floating gate 5, to thereby program the bitcell 10. This will leave the channel above the floating gate 5 in a non-conducting state.

Read Operation

Figure 6:
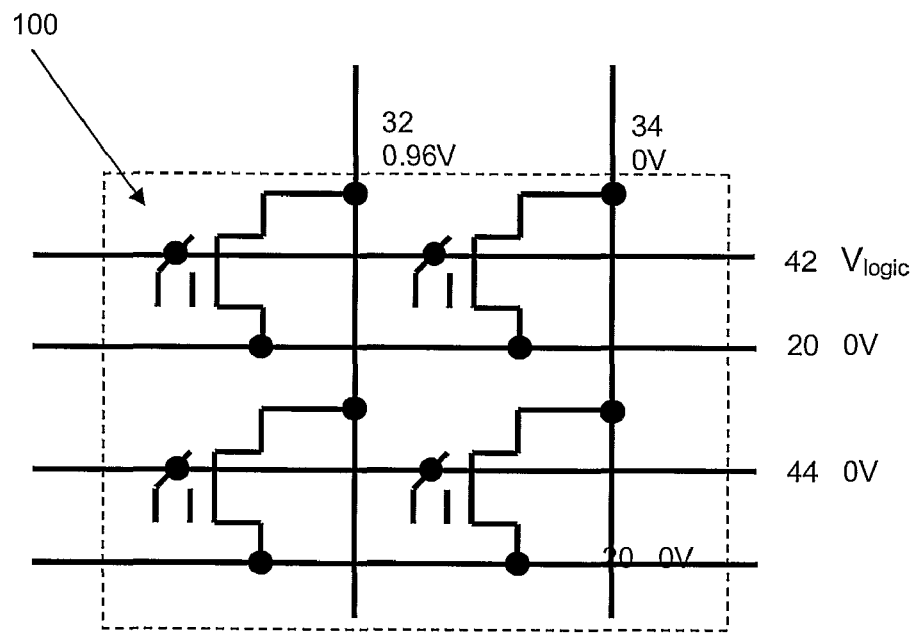
FIG. 6 is a schematic diagram of an example of the voltage bias conditions applied to the array of FIG. 3 during read of the top left bitcell in the array.

FIG. 6 shows the bias conditions applied to the same non-volatile memory array 100 during a read operation on the top left bitcell 10.

During the read operation, all sourcelines 20 are grounded (i.e. held at 0V), and any unselected wordlines 44 and bitlines 34 are also grounded. Meanwhile, the selected wordline 42 is driven to $V_{logic}$, and the selected bitline 32 is driven to its read voltage, which in the example given is 0.96V.

The amount of charge stored on the floating gate 5 of a bitcell 10 effects the turn on voltage of the transistor forming the bitcell 10. Accordingly, bitcells are "read" by detecting how much current flows in the bitcell 10 when a set voltage is applied to the bitcell. The current is detected using senseamps (not shown in figures). This current will be discriminated against a threshold to decide whether the bitcell 10 is in a programmed (non-conducting) or erased (conducting) state. The bias conditions applied during program operation are carefully chosen and maintained such that only the potential of the floating gate 5 on the bitcells 10 which are meant to programmed are actually changed. Any potential erasure of bitcells 10 sitting on the same wordline 40, or sitting on the same bitline 30 within the same memory sector (where the programming high voltage is applied) will limit the performance or endurance of the total memory.

As will be appreciated from the above description, and general knowledge in this field, wordline drivers will be in one of three operating modes: Erase operation mode; Program operation mode; and Read operation mode. Further, in any particular operating mode, there will be selected and unselected wordlines 40. Therefore there are seven states for a wordline driver (including standby state) when power is applied to the device.

Figure 7:
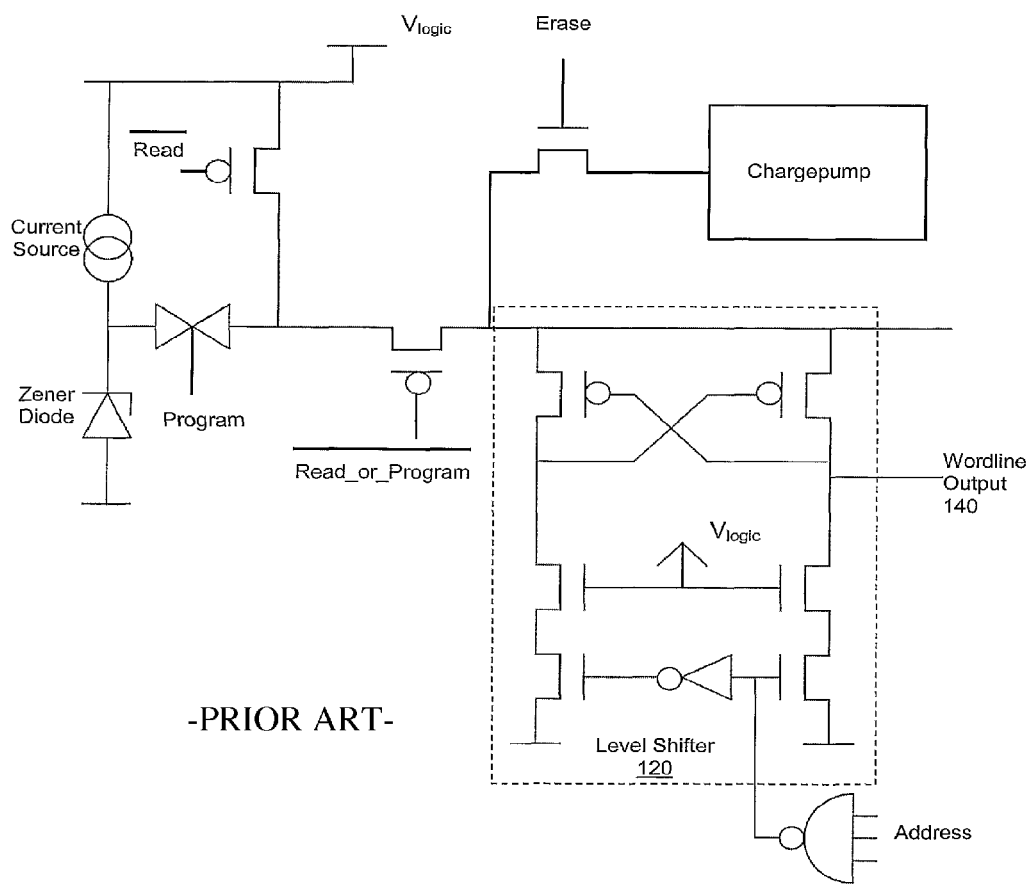
FIG. 7 is a schematic diagram of a wordline driver according to the prior art.

FIG. 7 shows a wordline driver according to the prior art. It comprises a level shifter 120 driving the wordline driver output 140, with the supply of the level shifter 120 being switched between the desired voltage levels the wordline driver should output when the particular wordline driver is selected.

As can be seen from the above exemplary description of Erase, Program and Read operations of a non-volatile memory array 100, the wordline driver, which supplies the voltages required by the wordlines, must be able to supply the voltages shown below (for the example given, at least):

TABLE 1

| | Wordline driver Output | |
|---|---|---|
| Operation | Selected | Unselected |
| Read | $V_{logic}$ = 2.7 V | 0 V |
| Erase | $V_{erase}$ = 13.5 V | 0 V |
| Program | $V_{pwl}$ = 2.1 V | 0 V |

As discussed in the introduction, since the wordline driver uses switched supplies in order to drive the required levels, the output impedance is compromised, and also the high voltages which are required to be applied to the transistors eventually cause their degradation and result in a limited lifetime of the non-volatile memory device.

Figure 8:
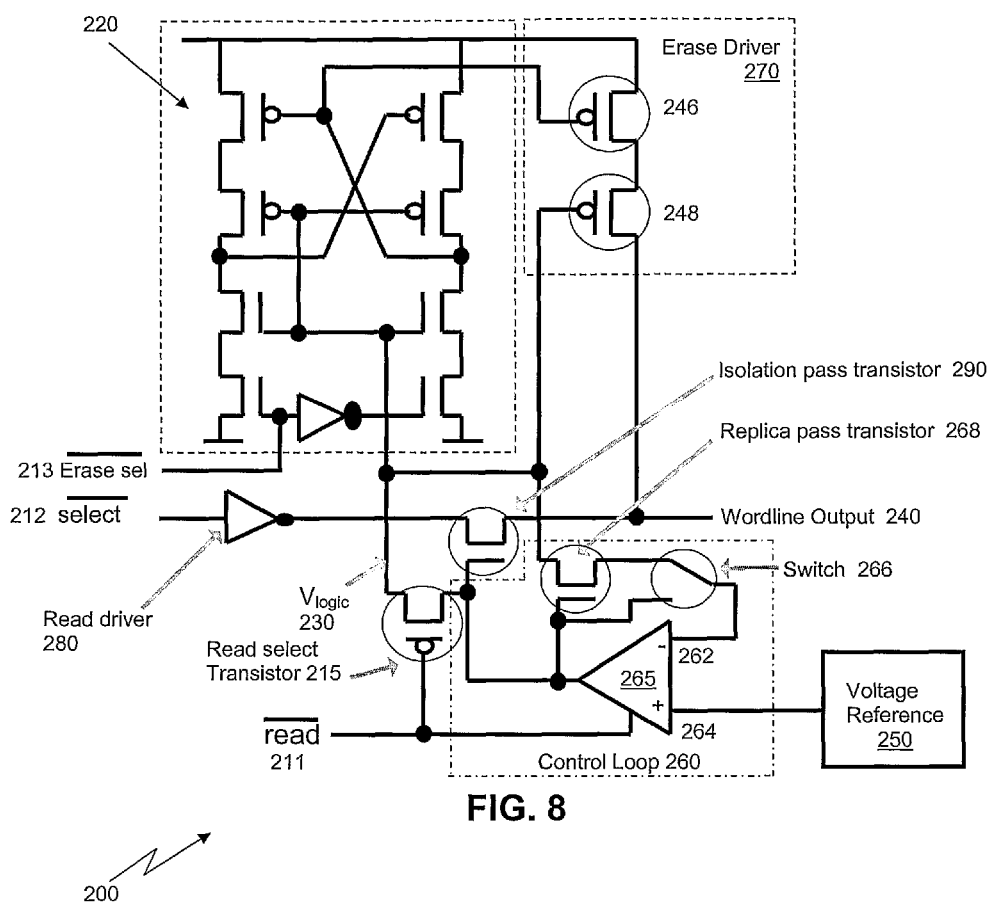
FIG. 8 is a schematic diagram of a wordline driver according to an embodiment of the present invention.

FIG. 8 shows an embodiment of the wordline driver 200 according to the present invention, capable of providing the above described wordline output voltages. The same, or similar, parts of the circuit to the prior art are labelled with the same numerals plus 100.

The embodiment of the wordline driver 200 shown comprises three active-low inputs: read 211, select 212 and erase select 213. These inputs set the required state, and therefore the voltage at the output 240, of the wordline driver 200.

The wordline driver further includes a read select/bypass PMOS transistor 215, a level shifter 220, a logic level voltage supply ($V_{logic}$) 230, an output 240, a voltage reference 250, a control loop 260, a first power source, such as an erase driver 270, a second power source, such as a read driver 280, and an isolation transistor 290.

The transistors used in the wordline driver 200 may be either PMOS or NMOS devices. As is known in the art, such devices have a control electrode, i.e. gate, and first and second current electrodes, i.e. their source and drain.

The read select/bypass PMOS transistor 215, when turned on by applying a low voltage (i.e. equivalent to a "0" in logic terms), connects the gate of the isolation transistor 290 to logic supply, $V_{logic}$. This is done to strongly turn on the isolation transistor 290, to thereby fully connect the read driver 280 to the wordline output 240 during a Read operation, as described fully below.

The cascoded level shifter 220 supplies the erase level voltage to the erase driver 270 during erase operation, and a normal, logic, level voltage at other times. The level shifter is constructed as is commonly known in the art, and as shown in the figures.

Figure 15:
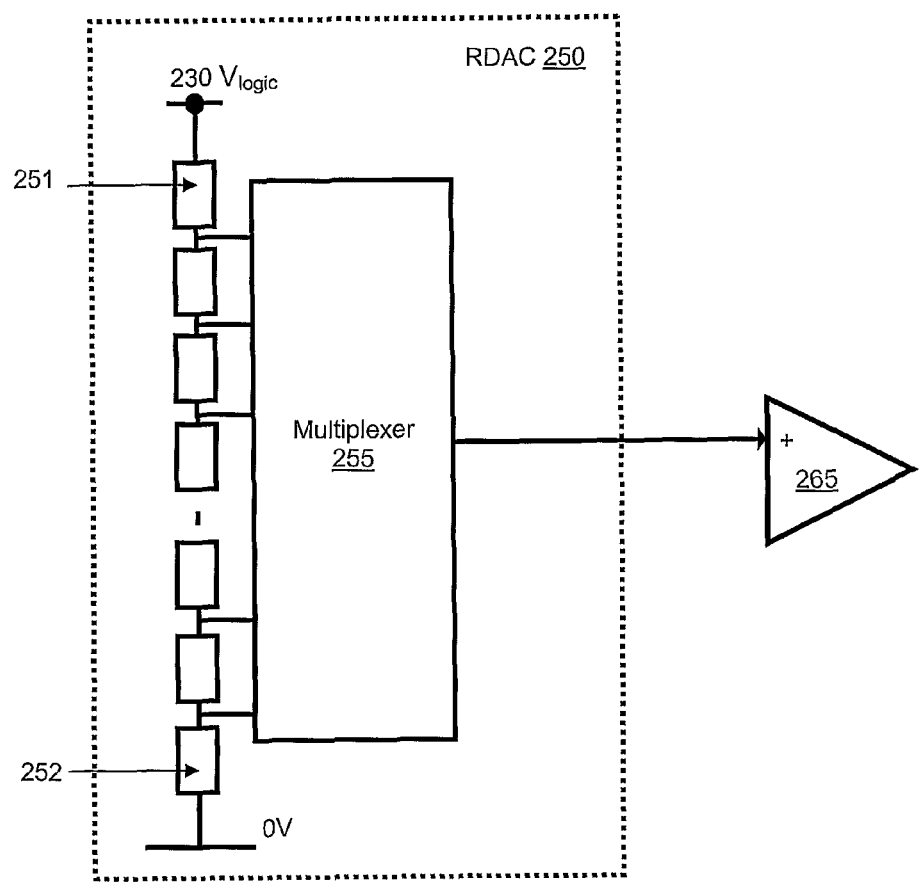
FIG. 15 is a schematic diagram of the voltage reference of FIG. 8, according to an embodiment of the present invention.

The voltage reference 250 is in an embodiment a programmable voltage reference and will be described in more detail below, with respect to FIG. 15.

The control loop 260 comprises a second, replica, isolation transistor 268, an operational amplifier 265 in a feedback configuration, and a switch 266 for switching the replica transistor 268 in and out of the operational amplifier's 265 feedback loop. The voltage reference 250 provides its output voltage to the non-inverting input 264 of the operational amplifier 265. The operational amplifier 265 is disabled by applying an active low signal on the read input 211.

The erase driver 270 is formed from two cascoded PMOS transistors 246 and 248, connected between the erase voltage supply coming out of the level shifter 220, and the wordline output 240.

The operation of the wordline driver circuit 200 according to the present invention, for achieving each of the required voltages of Table 1 above, will now be described with reference to FIGS. 9 to 14. It should be noted that in real life applications, multiple wordlines may be multiplexed onto the output of a single wordline driver 200, to enable wordline driver 200 reuse.

Selected Erase Output

Figure 9:
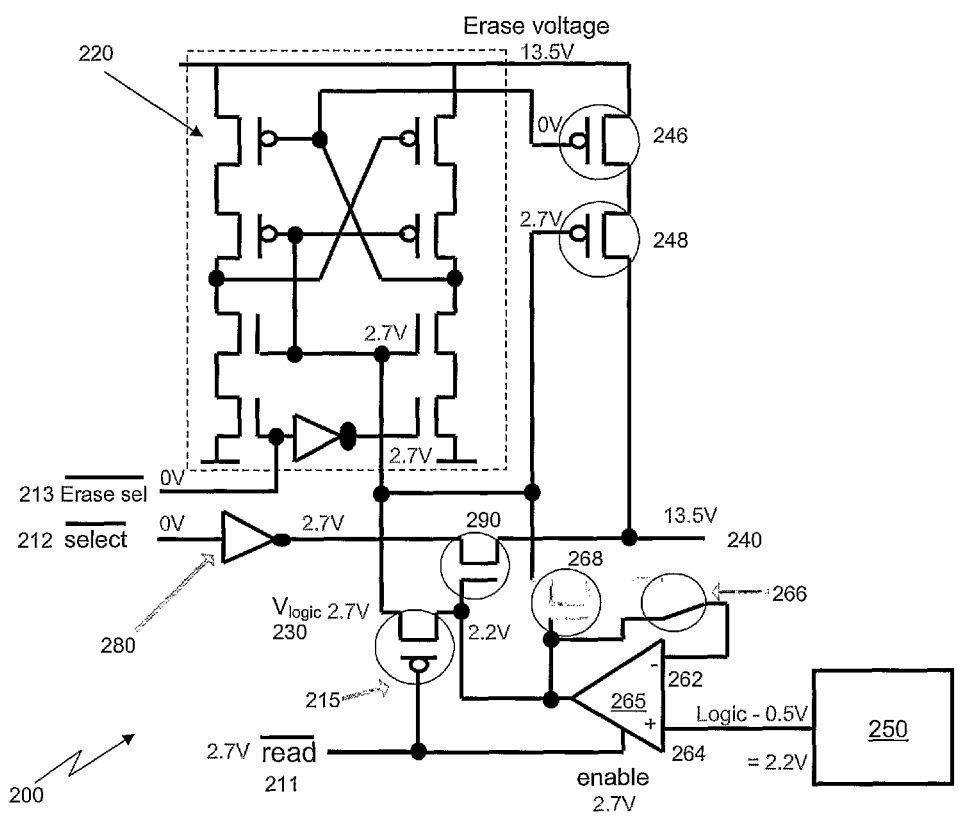
FIG. 9 is a schematic diagram of the wordline driver of FIG. 8 configured for erase operation on a selected wordline.

FIG. 9 shows the wordline driver 200 of the present invention in the state of supplying the erase voltage, $V_{erase}$ (~13.5V) to a selected wordline, such as wordline 42 in FIG. 4. To achieve this state, the select input 212 and erase select input 213 are both held logic low (i.e. 0V), while the third input, read select 211, is held logic high (i.e. 2.7V).

During the erase operation, the voltage reference 250 is set to logic supply −0.5V (equalling 2.2V in the example given). The voltage reference 250 is set at this level to ensure the isolation transistor 290 is just switched off, therefore reducing the voltage difference experienced across the isolation transistor 290 to its lowest possible level. This is done to maximise the endurance of the isolation transistor 290 (by reducing the voltage stresses applied across the transistor). It will be appreciated that the actual level the voltage reference 250 is set to is related to the characteristics of the isolation transistors used. Equally, since the voltage reference 250 is programmable, it is possible to alter this voltage dynamically, according to the needs of the circuit in general.

Since the read select input 211 is high, the operational amplifier 265 is enabled. Also, the switch 266 is in the position such that it excludes the replica isolation transistor 268 from the feed back loop of the operational amplifier 265. This means the operational amplifier is in a unity gain feedback configuration, and thus drives its output to equal the voltage reference inputted at its non-inverting input 264.

With the circuit 200 in the above described mode, the isolation transistor 290 is off, because the gate input to the isolation transistor 290 is being held below the voltage of its source being driven by the read driver 280 to logic supply (2.7V). Meanwhile, the power supply to the cascoded erase driver 270 is set to 13.5V by the level shifter 220.

At the same time, PMOS transistors 246 and 248 are both on, because both their inputs are being held at a voltage below the erase driver 270 supply voltage level (13.5V). This results in them connecting the wordline output 240 to the erase voltage power supply rail coming out of the level shifter 220. This means the output of the wordline driver 240 is held at the required 13.5V. Note, sine the wordline forms just a capacitive load, after charge up, there is no significant current flowing other than leakage of the isolation transistor 290.

The input of the first PMOS transistor 246 is dependent upon the erase select input 213, while the input to the second PMOS transistor 248 is directly connected to the logic supply 230, and therefore is constantly held at logic supply (~2.7V). Note: the cascode transistor 248 is used to limit the field across devices which may harm them or run them into breakdown. When the driver is turned on, the cascode is actually not needed. During unselected operation though, the field across the switch transistor is only high voltage (13.5V) minus logic voltage (2.7V), because the cascode will pinch off at supply voltage level. Therefore the drain of the switch PMOS transistor 246 cannot go lower in potential.

Unselected Erase Output

Figure 10:
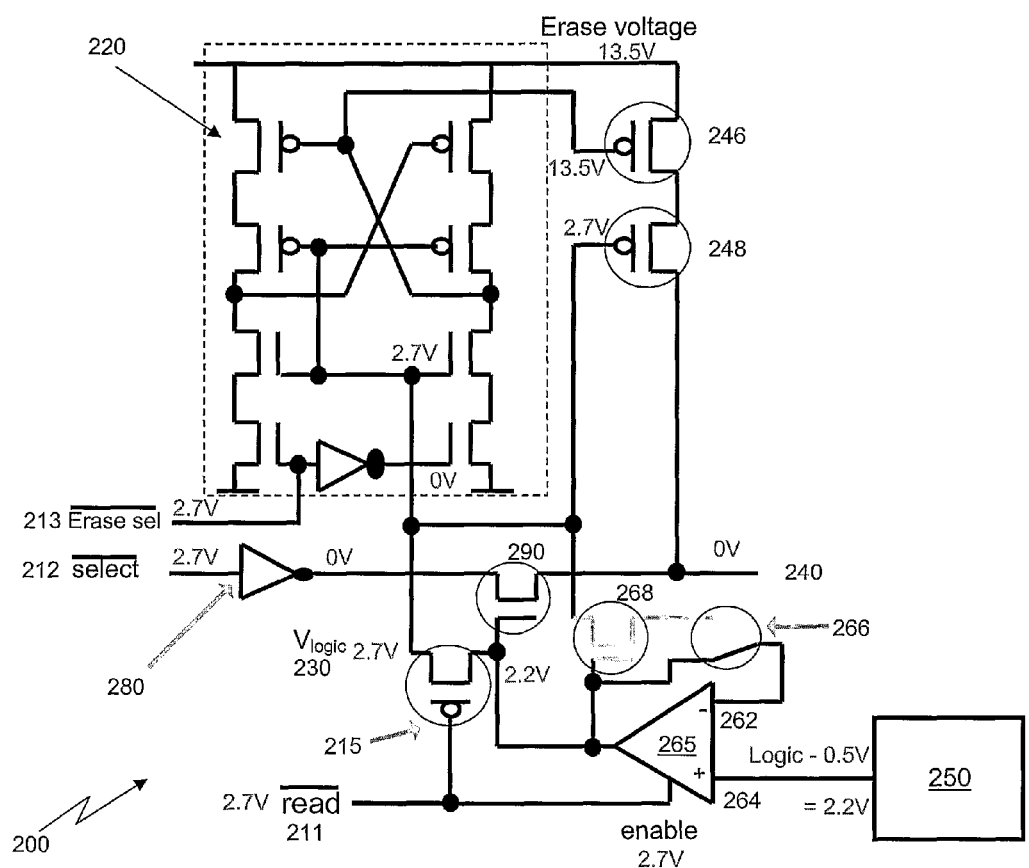
FIG. 10 is a schematic diagram of the wordline driver of FIG. 8 configured for erase operation on an unselected wordline.

Turning now to FIG. 10, the operation of unselected wordlines, such as wordline 44 of FIG. 4, during erase will now be described.

Most of the circuit 200 remains in the same state as described above, in particular, the control loop 260 and voltage reference 250.

However, now the select input 212 and erase select input 213 have both been flipped to logic high (~2.7V). This results in the first PMOS transistor 246 having 13.5V applied to its gate, which means it is turned off. This isolates the wordline output 240 from the 13.5V erase driver voltage supply rail. Also, the read driver 280 logically inverts the select input 212, therefore the source electrode of the isolation transistor 290 is 0V. This is now below the 2.2V gate input of the isolation transistor 290 provided by the control loop 260, therefore the isolation transistor 290 is on, and the 0V outputted from the read driver 280 is passed through to the wordline output 240.

Selected Program Output

Figure 11:
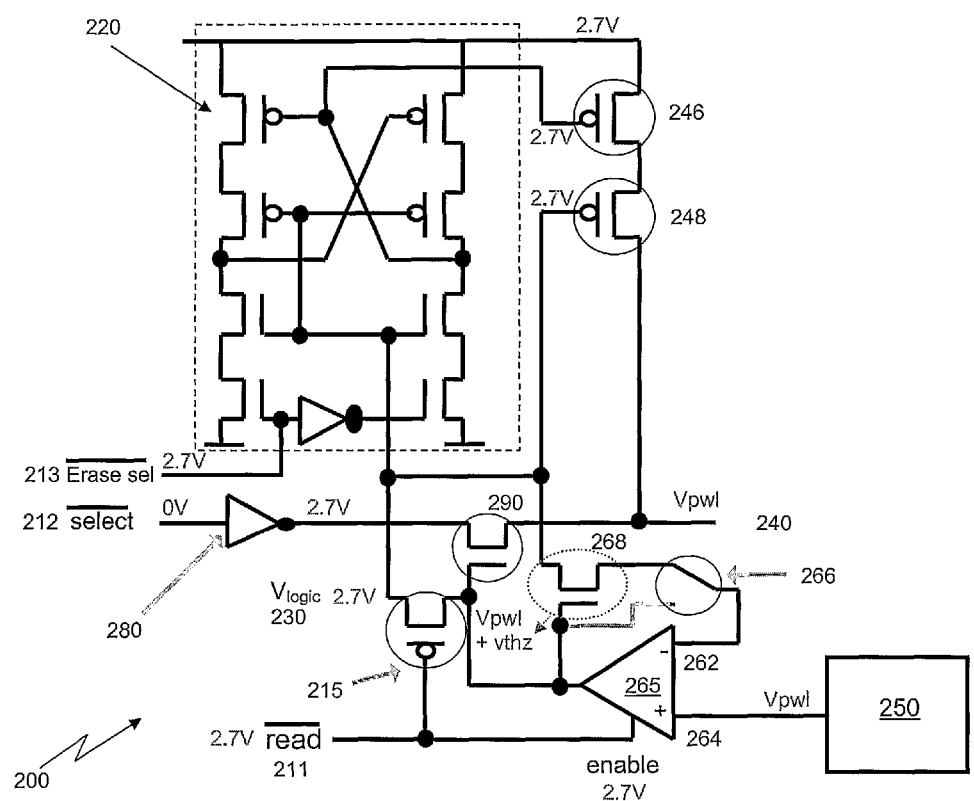
FIG. 11 is a schematic diagram of the wordline driver of FIG. 8 configured for program operation on a selected wordline.

Referring now to FIG. 11, the operation of selected wordlines, such as wordline 42 of FIG. 5, during program will now be described. During both read and program operations, the voltage supplied from the low level shifter 220 is set to logic supply (i.e. 2.7V in this example).

In this state, the select input 212 is held logic low (i.e. 0V), while the erase select input 213 and read select input 211 are held logic high (i.e. 2.7V).

During the program operation, the voltage reference 250 is set to the desired wordline program voltage, Vpwl. This voltage may range between 1.7 and 2.4V. However, in the present example, it is set to 2.1V.

Again, since the read select input 211 is high, the operational amplifier 265 is enabled. However, now the switch 266 is in the position such that it includes the replica isolation transistor 268 in the feedback loop of the operational amplifier 265. This means the operational amplifier is in a feedback configuration in which the voltage drop across the replica transistor 268 is fed back to the inverting input 262 of the operational amplifier 265. Thus the output of the control loop 260, which controls the gate input to the isolation transistor 290, is set to equal the voltage reference inputted at its non-inverting input 264 (Vpwl), plus the voltage drop across the replica transistor 268 (Vthz).

At the same time, PMOS transistors 246 and 248 are both off, because both their inputs are being held at a voltage equal to the erase driver supply voltage level (2.7V). This results in them isolating the wordline output 240 from the voltage power supply rail coming out of the level shifter 220. This, in combination with the previously described biasing of the isolation transistor 290, results in the output of the wordline driver 240 being driven to equal the output of the voltage reference 250 (which is, in turn, set to the voltage level required by the particular 1.5T bitcell in order to program it and, at the very same time, keeping the desired disturb margins). In effect, the inclusion of the replica transistor 268 in the control loop 260, means the real isolation transistor 290 has exactly the right voltage applied to its gate to pass the desired voltage, Vpwl.

Unselected Program Output

Figure 12:
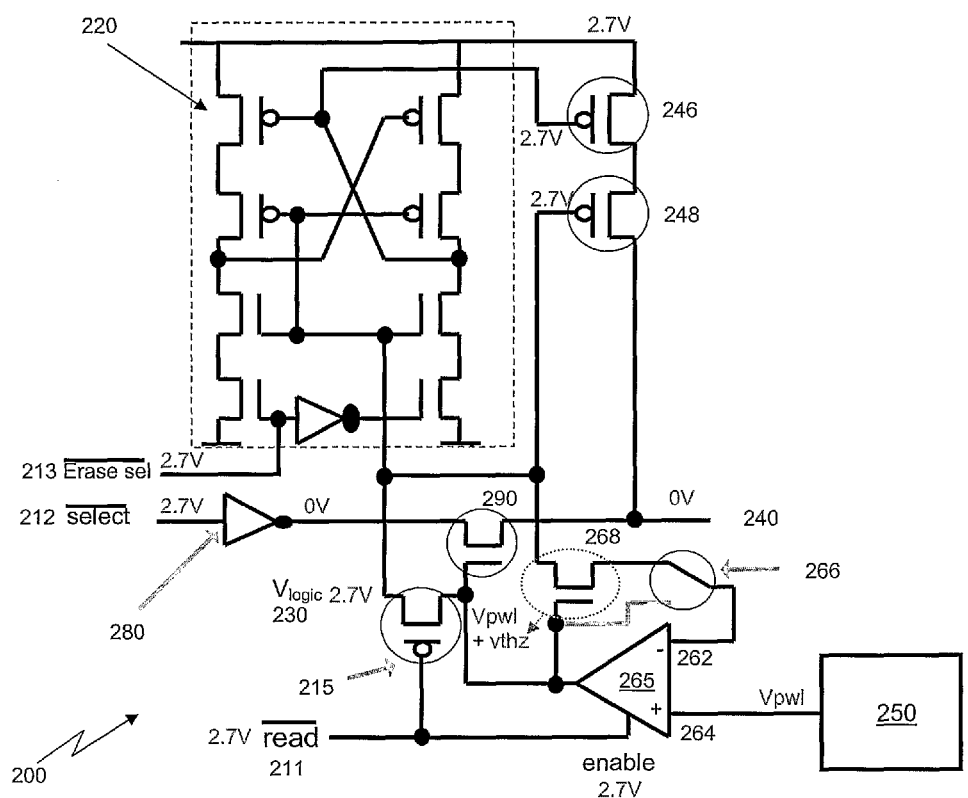
FIG. 12 is a schematic diagram of the wordline driver of FIG. 8 configured for program operation on an unselected wordline.

Referring now to FIG. 12, the operation of unselected wordlines, such as wordline 44 of FIG. 5, during program will now be described. The circuit is in the same configuration as for the selected worldines 42, except the select input 212 is now reversed in value.

This results in the voltage at the source node of the isolation transistor 290 being 0V, which is below the voltage being applied to the gate input of the isolation transistor 290. Therefore the isolation transistor 290 is on, and passes the 0V output of the read driver 280 on to the wordline output 240.

Selected Read Output

Figure 13:
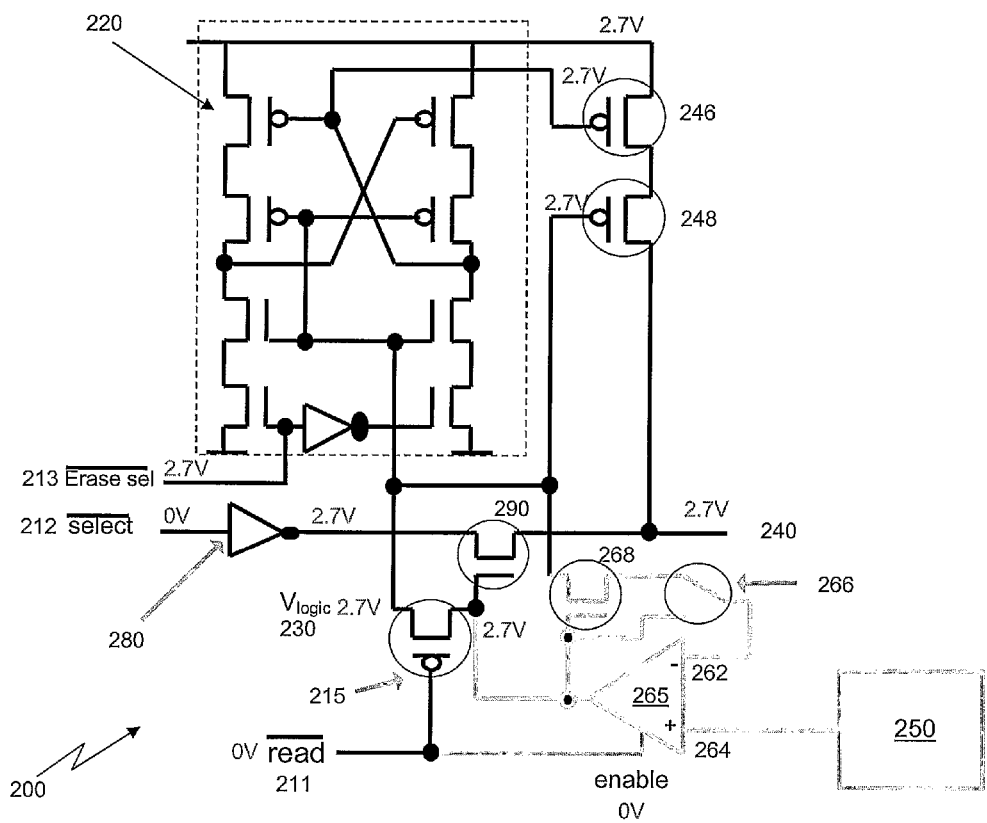
FIG. 13 is a schematic diagram of the wordline driver of FIG. 8 configured for read operation on a selected wordline.

Referring now to FIG. 13, the operation of selected wordlines, such as wordline 42 of FIG. 6, during a read operation will now be described. As mentioned previously, the voltage supplied to the low level shifter 220 during the read cycle is set to logic supply, $V_{logic}$ (i.e. 2.7V in this example).

In this state, the select input 212 and read select input 211 are held logic low (i.e. 0V), while the erase select input 213 is held logic high (i.e. 2.7V).

Because the read select input 211 is now low, the active high enable input to the operational amplifier 265 of the control loop 260 is now off. Accordingly, the control loop 260 is deactivated. This means the voltage reference 250 is not being used, and can therefore be set to a standby value.

Also as a result of the control loop 260 now being deactivated, the position of the switch 266 is irrelevant.

At this time, PMOS transistors 246 and 248 are both off, because both their inputs are being held at a voltage equal to their supply level. This results in them isolating the wordline output 240 from the voltage power supply rail coming out of the level shifter 220.

Also at this time, since the read select input 211 is now low, the PMOS read select transistor 215 is now on. This means that the gate input to the isolation transistor 290 is now connected to the logic supply rail 230, therefore the isolation transistor is on, and thus passing the 2.7V output of the read driver 280 onto the wordline driver output 240, thereby producing the required 2.7V output at this point. This happens because the standby level on the gate of the isolation transistor 290 is higher than the 2.7V plus the Vthz (voltage drop across the replica transistor 268) being applied to the gate of the isolation transistor 290.

Unselected Read Output

Figure 14:
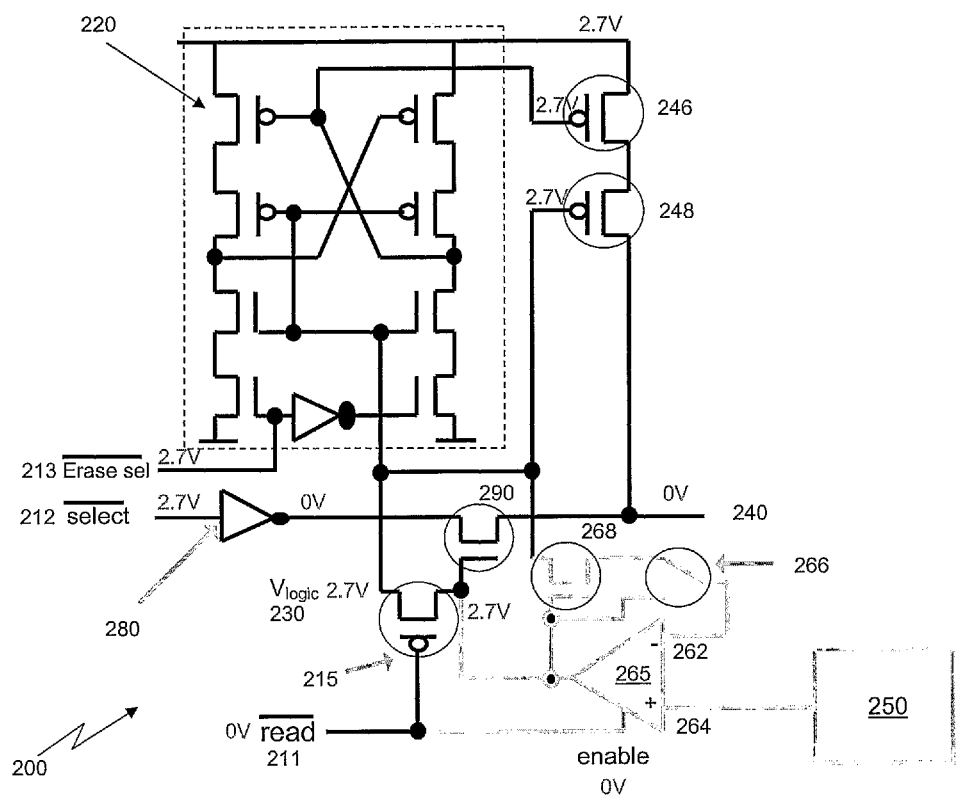
FIG. 14 is a schematic diagram of the wordline driver of FIG. 8 configured for read operation on an unselected wordline.

Referring now to FIG. 14, the operation of unselected wordlines, such as wordline 44 of FIG. 6, during read will now be described. In this configuration, everything is in the same position as described above in relation to the selected read output, except that the select input 212 is now inverted. This causes the output of the read driver 280 to become 0V, which is again passed through to the wordline driver output 240, since the read enable input 211 is holding the gate input to the isolation transistor at logic supply level (2.7V).

Voltage Reference

In the specific embodiment of the present invention, the voltage reference 250 is a programmable voltage reference 250 formed from a resistor divider network type Digital to Analog Converter (RDAC). FIG. 15 shows one embodiment of such a RDAC 250.

In the above described example, the RDAC 250 is designed to supply voltages between 1.7 and 2.4V. However the values required are dependent upon the specifications of the particular non-volatile device, and other voltages may be required instead.

Regardless of the actual voltages required, the RDAC can be designed according to the particular circuit's needs. This is because the RDAC 250 is constructed out of resistors 251 connected in series across the logic supply, $V_{logic}$ (i.e. 2.7V), with a digitally controlled multiplexer 255 feeding off each of the taps between the resistors 251. In this way, a particular tap off the resistor network, corresponding to a set voltage, can be freely selected by the multiplexer 255. It should be noted that if higher voltages are required than can be achieved using the logic supply level, then the erase voltage supply, or any other higher voltage supply available to the circuit, can be used to feed the RDAC 250 instead (i.e. 13.5V).

Control signals applied to a control input (not shown) of the multiplexer 255 control the selection of the tap off of the resistor network and so determine the level of the voltage signal at the output of the multiplexer 255. The control signals may be generated by a main processing unit (not shown) of the device of which the non-voltage memory is part (e.g. the main CPU of an embedded microcontroller) or may be generated by a processing unit (not shown) dedicated for controlling the non-volatile memory.

In the particular case above, where the RDAC 250 is only needing to supply 1.7 to 2.4V, the logic supply is adequate, and unit resistors can be used to produce the required taps. The voltage range of the RDAC 250 is kept within the upper portion of the logic supply by using a larger bottom resistor 252 in the resistor network of the RDAC 250.

The number and values of the resistors will vary according to the voltage levels to be supplied. For example, 27 unit resistors may be used to provide voltages between 1.7V and 2.4V, as is the case in the example given.

The foregoing has been explained making use of particular transistor types and voltage levels as an example only. It will be apparent to the person skilled in the art that other specific types of bitcells 10 will make use of other voltages, and the present invention may equally be applied to these other voltages.

From the above description of the invention, it can be seen that the wordline driver 200 according to the present invention is capable of providing a dual supply wordline driver that ensures the endurance of the isolation transistor 290 by using a control loop 260 to drive the isolation transistor, and therefore the endurance of the wordline driver as a whole, is maximised. This is done by only driving the isolation transistor 290 with voltages that keep the voltage differences experienced across the isolation transistor to their minimum (i.e. it is only driven in a non-saturated mode). Therefore, the voltage stresses experienced across the insulating oxide layer of the isolation transistor 290 are reduced to a minimum. This, in turn, reduces the chance of oxide layer punch through.

This is all done by using a replica of the isolation transistor in the control loop 260 to provide a voltage drop at the output of the control loop 260 equal to the voltage required to just turn on the isolation transistor.

Further, the advantage of using a programmable voltage reference 250, instead of using a fixed value voltage reference whose output is fixed by the physical parameters of the devices forming the voltage reference, is that it allows the reference voltage to be set to a value best adapted to the needs of the isolation transistor 290. This helps to minimise the chance of program disturbs, or unwanted device degradation. It also allows the voltage reference to be changed without needing to re-manufacture the device. Also, any change in the value of the voltage reference may be carried out during operation of the device, for example, to counteract changes in the circuit occurring due to variables such as temperature. This helps to achieve optimum endurance levels.

Operating parameters of the non-volatile memory device include the voltage bias conditions required to respectively program, erase and read a bitcell. These parameters may relate to the size and particular structure of the type of bitcell used in the non-volatile memory array. These parameters may also be temperature dependent.

By using two independent drivers, one suitable to drive high voltage levels slowly (because non-volatile memory erasure and program operations are slow by nature) with high endurance, and the other suitable to drive low voltage swings very fast (by reducing the output impedance to the lowest possible value) in order to provide fast read out of the memory contents, the output impedance of the driver in accordance with the present invention during the respective operations (program/erase/read) can be optimised. Further, since the read and erase drivers are separated in an embodiment of the present invention, the erase driver may be fully cascoded to maximise its endurance, without the increase in impedance associated with a cascoded driver affecting the read performance of the device.

Also, the present invention's use of dual power sources allows the supply connections to be fixed, therefore avoids the compromise of the impedance through use of switches in the supplies.

The invention claimed is:

1. A wordline driver for a non-volatile memory device, the wordline driver comprising:
a wordline driver output;
a first power source, adapted to provide an erase level voltage for erasing portions of the non-volatile memory device;
a second power source, adapted to provide read and program level voltages for reading and programming portions of the non-volatile memory device;
first switching means adapted to connect the wordline driver output to a one of the first and second power sources dependent upon an operating mode of the wordline driver, the first switching means including an isolation transistor adapted to selectively connect the second power source and the wordline driver output; and
a programmable switch controller for providing a variable control signal to a control electrode of the isolation transistor, the programmable switch controller being arranged to set the variable control signal to a value dependent upon at least one operating parameter of the non-volatile memory device, and wherein the programmable switch controller further comprises:
a voltage reference having an output; and
a control loop connected between the output of the voltage reference and the control electrode of the isolation transistor and configured to adapt the output of the voltage reference to provide the variable control signal to the control electrode of the isolation transistor.

2. A wordline driver for a non-volatile memory device, the wordline driver comprising:
a wordline driver output;
a first power source, adapted to provide an erase level voltage for erasing portions of the non-volatile memory device;
a second power source, adapted to provide read and program level voltages for reading and programming portions of the non-volatile memory device;
first switching means, including an isolation transistor, adapted to connect the wordline driver output to a one of the first and second power sources dependent upon an operating mode of the wordline driver; and
a programmable switch controller for providing a variable control signal to a control electrode of the isolation transistor, the programmable switch controller being arranged to set the variable control signal to a value dependent upon at least one operating parameter of the non-volatile memory device, wherein the programmable switch controller comprises:
a voltage reference having an output; and
a control loop connected between the output of the voltage reference and the control electrode of the isolation transistor and configured to adapt the output of the voltage reference to provide the variable control signal to the control electrode of the isolation transistor.

3. The wordline driver of claim 2, wherein the control loop comprises:
a first transistor, substantially identical to said isolation transistor, and configured for providing a compensation voltage to the control loop for adapting the output of the voltage reference; and
a second switching means, adapted to switch the first transistor in and out of said control loop in dependence upon an operating mode.

4. The wordline driver of claim 3, wherein the control loop further comprises an operational amplifier having:
an output coupled to said control electrode of the isolation transistor for providing the variable control signal;
a first input selectively coupled to the output of said voltage reference; and
a second input coupled to a first current electrode of the first transistor in dependence on the second switching means.

5. The wordline driver of claim 4, wherein a control electrode of said first transistor is connected to the control electrode of said isolation transistor and to the output of the operational amplifier, and a second current electrode of said first transistor is connected to a third power source.

6. The wordline driver of claim 5, wherein the second switching means is a changeover switch comprising two inputs and a single output, wherein the single output of said changeover switch is connected to the second input of the operational amplifier, one of the two inputs is connected to the output of the operational amplifier and the other of the two inputs is connected to the first current electrode of the first transistor, such that the changeover switch is operable to switch the first transistor in and out of said control loop.

7. The wordline driver of claim 5, wherein the programmable switch controller further comprises:
- a bypass transistor, connected between the third power source and the control electrode of the isolation transistor; and
- a read select input connected to a control electrode of the bypass transistor and to an enable input of the operational amplifier, such that the read select input is operable to disable the operational amplifier and connect the control electrode of the isolation transistor to the third power source during a read operating mode.

8. The wordline driver of claim 2, wherein the voltage reference is a programmable voltage reference.

9. The wordline driver of claim 8, wherein the programmable voltage reference is a Digital-to-Analog converter.

10. The wordline driver of claim 9, wherein the Digital-to-Analog converter is a resistor network Digital-to-Analog converter.

11. The wordline driver of claim 10, wherein the resistor network Digital-to-Analog converter comprises:
- a plurality of resistors connected in series across a power supply and having a plurality of output taps, wherein a node between two of said plurality of resistors is an output tap providing a fractional voltage of said power supply; and
- a multiplexer for selecting a one of the output taps for output.

12. The wordline driver of claim 11, wherein the plurality of resistors comprises a predetermined number of resistors, the predetermined number being selected such that a minimum desired output voltage and a suitable range of further output voltages, up to a maximum desired voltage, is provided.

13. The wordline driver of claim 2, wherein the at least one operating parameter of the non-volatile memory device includes an operating mode of the non-volatile memory device.

14. The wordline driver of claim 13, wherein the operating mode of the wordline driver is one of:
a read operating mode, a program operating mode or an erase operating mode.

15. A non-volatile memory device comprising the wordline driver according to claim 2.

16. In a wordline driver of a non-volatile memory device, a method comprising:
selectively connecting a wordline driver output of the wordline driver to one of a first power source or a second power source dependent upon an operating mode of the wordline driver, the first power source adapted to provide an erase level voltage for erasing portions of the non-volatile memory device and the second power source adapted to provide read and program level voltages for reading and programming portions of the non-volatile memory device; and
providing, from a programmable switch controller of the wordline driver, a variable control signal to a control electrode of an isolation transistor adapted to selectively connect the second power source to the wordline driver output, the variable control signal being set to a value dependent upon at least one operating parameter of the non-volatile memory device, and wherein providing the variable control signal comprises adapting, via control loop of the programmable switch controller, an output of a voltage reference to provide the variable control signal to the control electrode of the isolation transistor.

17. The wordline driver of claim 1, wherein the programmable switch controller further comprises:
- an operational amplifier comprising an output coupled to said control electrode of the isolation transistor for providing the variable control signal;
- a bypass transistor, connected between a third power source and the control electrode of the isolation transistor; and
- a read select input connected to a control electrode of the bypass transistor and to an enable input of the operational amplifier, such that the read select input is operable to disable the operational amplifier and connect the control electrode of the isolation transistor to the third power source during a read operating mode.

18. A non-volatile memory device comprising the wordline driver according to claim 1.

* * * * *